United States Patent
Zhou et al.

(10) Patent No.: US 9,570,700 B2
(45) Date of Patent: Feb. 14, 2017

(54) ORGANIC ELECTROLUMINESCENT DEVICE AND PREPARATION METHOD THEREOF INCLUDING FORMING A CATHODE BY COMBINING ZINC OXIDE, ACETIC ACID AND A PHTHALOCYANINE SUBSTANCE

(71) Applicants: Mingjie Zhou, Guangdong (CN); Ping Wang, Guangdong (CN); Hui Huang, Guangdong (CN); Jixing Chen, Guangdong (CN)

(72) Inventors: Mingjie Zhou, Guangdong (CN); Ping Wang, Guangdong (CN); Hui Huang, Guangdong (CN); Jixing Chen, Guangdong (CN)

(73) Assignees: OCEAN'S KING LIGHTING SCIENCE & TECHNOLOGY CO., LTD., Shenzhen (CN); SHENZHEN OCEAN'S KING LIGHTING ENGINEERING CO., LTD., Shenzhen (CN)

( * ) Notice: Subject to any disclaimer, the term of this patent is extended or adjusted under 35 U.S.C. 154(b) by 0 days.

(21) Appl. No.: 14/431,972

(22) PCT Filed: Sep. 28, 2012

(86) PCT No.: PCT/CN2012/082281
§ 371 (c)(1),
(2) Date: Mar. 27, 2015

(87) PCT Pub. No.: WO2014/047866
PCT Pub. Date: Apr. 3, 2014

(65) Prior Publication Data
US 2015/0255745 A1  Sep. 10, 2015

(51) Int. Cl.
*H01L 51/52* (2006.01)
*H01L 51/50* (2006.01)
(Continued)

(52) U.S. Cl.
CPC ....... *H01L 51/5221* (2013.01); *H01L 51/0021* (2013.01); *H01L 51/0091* (2013.01);
(Continued)

(58) Field of Classification Search
None
See application file for complete search history.

(56) References Cited

U.S. PATENT DOCUMENTS

2015/0122334 A1* 5/2015 Otsubo ............ H01L 21/02422
136/263

FOREIGN PATENT DOCUMENTS

CN    1518132 A    8/2004
CN    102468446 A  5/2012
(Continued)

*Primary Examiner* — Michael Jung
*Assistant Examiner* — Jay C Chang
(74) *Attorney, Agent, or Firm* — Shimokaji IP

(57) ABSTRACT

Disclosed are an organic electroluminescent device and a preparation method thereof. The organic electroluminescent device is a top-emitting organic electroluminescent device having a reversed structure, and the preparation method is: dissolving zinc oxide with acetic acid to obtain a zinc oxide solution with a concentration of 0.3 g/ml-0.6 g/ml, adding a phthalocyanine substance in a mass of 1%-10% of the mass of the zinc oxide to obtain a mixture, spin-coating the mixture on a glass substrate (1) and then drying to obtain a cathode (2), and then preparing by vapor deposition, an electron injection layer (3), an electron transport layer (4), a luminescent layer (5), a hole transport layer (6), a hole injection layer (7) and an anode (8), successively, so as to obtain the organic electroluminescent device.

7 Claims, 1 Drawing Sheet

(51) Int. Cl.
*H01L 51/56* (2006.01)
*H01L 51/00* (2006.01)

(52) U.S. Cl.
CPC ...... *H01L 51/0092* (2013.01); *H01L 51/5092* (2013.01); *H01L 51/5231* (2013.01); *H01L 51/5234* (2013.01); *H01L 51/56* (2013.01); *H01L 2251/305* (2013.01); *H01L 2251/5315* (2013.01); *H01L 2251/5353* (2013.01); *H01L 2251/5369* (2013.01)

(56) References Cited

FOREIGN PATENT DOCUMENTS

| | | |
|---|---|---|
| EP | 1369938 A2 | 12/2003 |
| JP | H06290873 A | 10/1994 |
| JP | 2001296678 A | 10/2001 |
| JP | 2005183168 A | 7/2005 |
| WO | 2012042264 A2 | 4/2012 |
| WO | 2012105483 A1 | 8/2012 |

* cited by examiner

ORGANIC ELECTROLUMINESCENT DEVICE AND PREPARATION METHOD THEREOF INCLUDING FORMING A CATHODE BY COMBINING ZINC OXIDE, ACETIC ACID AND A PHTHALOCYANINE SUBSTANCE

FIELD OF THE INVENTION

The present invention relates to the field of organic electroluminescence, more particularly to an organic electroluminescent device and preparation method thereof.

BACKGROUND OF THE INVENTION

In 1987, C. W. Tang and VanSlyke in Eastman Kodak, an American company, reported a breakthrough in the search for organic electroluminescence. A double layer OLED having high brightness and high efficiency was successfully prepared by using ultrathin film technique. In such double layer device, the brightness can reach 1000 cd/m$^2$ at 10V, and its luminous efficiency was 1.51 lm/W. The device lifetime was more than 100 hours.

OLED works on the principle that: in the case of applied external field, electrons are injected from cathode into the lowest unoccupied molecular orbital (LUMO) of organic matters, while holes are injected from anode into highest occupied molecular orbital (HOMO) of organic matters. The electrons and the holes move towards each other and they recombine, forming excitons in luminescent layer. Such excitons migrate in the electric field, and energy transfer to luminescent material. Electrons are excited and jump from the ground state to an excited state. The decay of this excited state results in a radiative relaxation of the energy levels of the electron, accompanied by release of the energy as photon.

In some traditional OLEDs, luminous efficiency is only about 18%. Most of the light is lost due to the factors like absorption and total reflection. Bottom emitting structure is commonly used. Glass has a refractive index of 1.5, whereas ITO has a refractive index of 1.8. When the light emitted from the organic layer reaches the glass through ITO, total reflection occurs due to the difference in refractive index. In the same way, total reflection occurs whenever light is emitted from the glass to the air, resulting in reduction of luminous efficiency.

SUMMARY OF THE INVENTION

To solve the above problems, the present invention aims to provide a method for preparing an organic electroluminescent device. The organic electroluminescent device is a top-emitting organic electroluminescent device having a reversed structure, where a cathode is produced from zinc oxide and phthalocyanine substance to improve the electron injection. Moreover, light travels through the cathode, being scattered by crystals of the phthalocyanine substance. The light on both sides is collected at the center, thus improving luminous efficiency of the organic electroluminescent device.

The present invention also provides an organic electroluminescent device.

In a first aspect, the present invention provides a method for preparing organic electroluminescent device, comprising:
providing a clean glass substrate and then preparing a cathode on the glass substrate by the following steps:
dissolving zinc oxide with acetic acid to obtain a zinc oxide solution with a concentration of 0.3 g/ml-0.6 g/ml, followed by adding a phthalocyanine substance in an amount of 1%-10% by weight of the zinc oxide to obtain a mixture;
spin-coating the mixture on the glass substrate and then drying to obtain a cathode; the phthalocyanine substance is selected from a group consisting of copper phthalocyanine (CuPc), zinc phthalocyanine (ZnPc), magnesium phthalocyanine (MgPc) and vanadium phthalocyanine (V$_2$Pc$_5$);
preparing by vapor deposition, an electron injection layer, an electron transport layer, a luminescent layer, a hole transport layer, a hole injection layer and an anode being successively stacked on the cathode to obtain the organic electroluminescent device.

In the cathode, zinc oxide is dissolved to ionize zinc. After the step of drying, ionic compound of zinc is formed and acts as a conductor of electricity. Further, a phthalocyanine substance which is easy to crystallize should disperse in solution to form a uniform suspension. After drying, crystals structure becomes regular. Light should be scattered by the crystals, thus improving light intensity and efficiency of the organic electroluminescent device.

Preferably, a particle size of the zinc oxide is in a range of 50 nm-200 nm.

Analytical grade acetic acid is used. Zinc oxide reacts with acetic acid to produce zinc acetate. Zinc acetate is an ionic compound. Zinc exists in an ionic form. Other concentrations of the acetic acid solutions are also permitted. After dissolving zinc oxide, water and excess acetic acid should be removed by drying. Acetic acid is employed because it is a weak acid and is less corrosive to the glass substrate. In addition, acetic acid has a relatively low boiling point, making it possible to remove water and excess acetic acid at a low temperature. Acetic acid has weak polarity and is less prone to bonding with other substances.

Preferably, a thickness of the cathode is in a range of 10 nm-50 nm.

Preferably, the step of spin-coating is conducted at a speed of 2000 rpm-6000 rpm for 10 s-60 s. More preferably, the step of spin-coating is conducted at a speed of 3000 rpm for 20 s.

Preferably, the step of drying is conducted at a temperature of 100° C.-200° C. for 15 minutes –60 minutes. More preferably, the step of drying is conducted at a temperature of 150° C. for 30 minutes.

The glass substrate is common and commercially available glass.

Preferably, a material of the electron injection layer is cesium carbonate (Cs$_2$CO$_3$), cesium fluoride (CsF), cesium azide (CsN$_3$) or lithium fluoride (LiF). More preferably, a material of the electron injection layer is cesium carbonate (Cs$_2$CO$_3$).

Preferably, a thickness of the electron injection layer is in a range of 0.5 nm-10 nm. More preferably, a thickness of the electron injection layer is 1 nm.

Preferably, a material of the electron transport layer is 4,7-diphenyl-1,10-phenanthroline (Bphen) or N-phenyl benzimidazole (TPBI).

More preferably, material of the electron transport layer is Bphen.

Preferably, a thickness of the electron transport layer is in a range of 40 nm-80 nm. More preferably, a thickness of the electron transport layer is 60 nm.

Preferably, a material of the luminescent layer is 4-(dicyanomethylene)-2-tert-butyl-6-(1,1,7,7-tetramethyljulolidin-9-yl-vinyl)-4h-pyran (DCJTB), 9,10-di(1-naphthyl)anthracene (ADN), 4,4'-bis(9-ethyl-3-carbazovinylene)-1,1'-biphenyl (BCzVBi) or tris(8-hydroxyquinolinato) aluminium ($Alq_3$). More preferably, a material of the luminescent layer is tris(8-hydroxyquinolinato)aluminium ($Alq_3$).

Preferably, a thickness of the luminescent layer is in a range of 5 nm-40 nm. More preferably, a thickness of the luminescent layer is 15 nm.

Preferably, a material of the hole transport layer is 1,1-bis[4-(N,N-di(p-tolyl)amino)phenyl]cyclohexane (TAPC), 4,4',4''-tris(carbazol-9-yl)-triphenylamine (TCTA) or N,N'-di-[(1-naphthalenyl)-N,N-diphenyl]-(4,4'-biphenyl)-4,4'-diamine (NPB). More preferably, a material of the hole transport layer is 4,4',4''-tris(carbazol-9-yl)-triphenylamine (TCTA).

Preferably, a thickness of the hole transport layer is in a range of 20 nm-60 nm. More preferably, a thickness of the hole transport layer is 40 nm.

Preferably, a material of the hole injection layer is molybdenum trioxide ($MoO_3$), tungsten trioxide ($WO_3$) or vanadium pentoxide ($V_2O_5$). More preferably, a material of the hole injection is molybdenum trioxide ($MoO_3$).

Preferably, a thickness of the hole injection layer is in a range of 20 nm-80 nm. More preferably, a thickness of the hole injection layer is 30 nm.

Preferably, a material of the anode is silver (Ag), aluminium (Al), platinum (Pt) or gold (Au). More preferably, a material of the anode is silver (Ag).

Preferably, a thickness of the anode is in a range of 80 nm-250 nm. More preferably, thickness of the anode is 150 nm.

Preferably, the vapor deposition is vacuum evaporation, and the vapor deposition is conducted at a pressure of $2\times10^{-5}$ Pa-$5\times10^{-3}$ Pa at a speed of 0.1 nm/s-10 nm/s.

More preferably, the pressure of the vapor deposition is $5\times10^{-4}$ Pa. A speed of depositing the electron injection layer, the electron transport layer, the luminescent layer, the hole transport layer and the hole injection layer is 1 nm/s. A speed of depositing the anode is 5 nm/s.

In another aspect, the present invention provides an organic electroluminescent device comprising a glass substrate, a cathode, an electron injection layer, an electron transport layer, a luminescent layer, a hole transport layer, a hole injection layer and an anode stacked successively, wherein the cathode consists of zinc oxide (ZnO) and phthalocyanine substance, and the phthalocyanine substance is selected from a group consisting of copper phthalocyanine (CuPc), zinc phthalocyanine (ZnPc), magnesium phthalocyanine (MgPc) and vanadium phthalocyanine ($V_2Pc_5$); phthalocyanine substance is in an amount of 1%-10% by weight of the zinc oxide.

Preferably, a particle size of the zinc oxide is in a range of 50 nm-200 nm.

Preferably, a thickness of the cathode is in a range of 10 nm-50 nm.

The organic electroluminescent device uses a reversed structure, and the cathode uses zinc oxide and a phthalocyanine substance as starting materials. The primary starting materials used for preparing cathode is ZnO. ZnO has a work function up to 5.4 eV, which is close to electron injection barrier. Zinc oxide is dissolved to produce zinc acetate; however, there is no big change in the work function. The high work function benefits electron injection, thus it will help to improve luminous efficiency of the organic electroluminescent device. In addition, ITO (i.e. Indium Tin Oxide), an oxide of a rare element, has a somewhat toxicity.

The present invention can solve this problem by preparing a cathode using ZnO, and preparing an anode using metal. Cathode contains a material of phthalocyanine substance which is easy to crystallize and form a regular crystal structure. Light should be scattered by the crystals, and the light on both sides is collected at the center, thus improving luminous efficiency of the organic electroluminescent device.

The present inventions providing organic electroluminescent device and preparation method thereof comprise the following advantages:

(1) The provided preparation method involves preparing a cathode on a substrate by using zinc oxide and phthalocyanine substance to improve electron injection. Moreover, phthalocyanine substance is easy to crystallize and form a regular crystal structure. Light should be scattered by the crystals, and the light on both sides is collected at the center, thus improving luminous efficiency.

(2) The organic electroluminescent device uses a reversed structure, which significantly improves luminous efficiency, and the preparation method is simple and has a broad application prospect.

DETAILED DESCRIPTION OF ILLUSTRATED EMBODIMENTS

Figure 1:
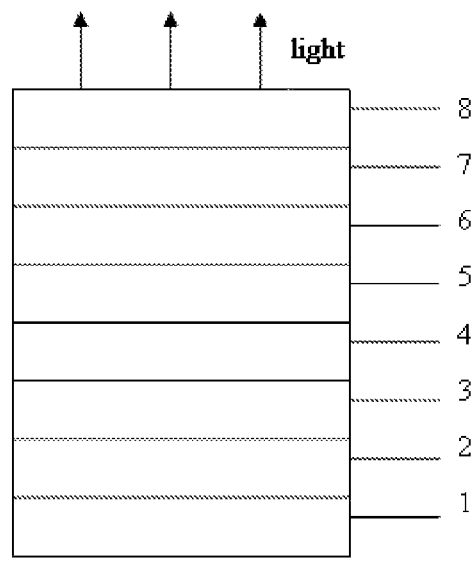
FIG. 1 shows structure of the organic electroluminescent device comprising a glass substrate 1, a cathode 2, an electron injection layer 3, an electron transport layer 4, a luminescent layer 5, a hole transport layer 6, a hole injection layer 7 and an anode 8.

The invention will now be described in detail on the basis of preferred embodiments. It is to be understood that various changes may be made without departing from the spirit and scope of the inventions.

Example 1

A method for preparing organic electroluminescent device comprises the following steps.

(1) After a photolithography process, glass was cut into the size of 2×2 cm and the luminous area was 0.3×0.3 cm. The glass was then sonicated successively with detergent, deionized water, acetone, ethanol and isopropanol for 15 minutes to remove the organic pollutant on the surface of the glass. 5 g of zinc oxide having a particles size of 100 nm were dissolved with 10 ml of acetic acid to obtain a zinc oxide solution with a concentration of 0.5 g/ml, followed by adding 0.25 g of CuPc to obtain a mixture. The mixture was coated on the glass by spin coating at a speed of 4000 rpm for 20 s. Then the glass was dried at 200° C. for 15 minutes to obtain a cathode. Thickness of the cathode was 20 nm.

(2) An electron injection layer of $Cs_2CO_3$, an electron transport layer of Bphen, a luminescent layer of $Alq_3$, a hole transport layer of TCTA, a hole injection layer of $MoO_3$ and an anode of Ag were vapor deposited successively on the cathode to obtain an organic electroluminescent device. The vapor deposition was conducted on a high vacuum deposition device (Shenyang Scientific Instrument Development Center Co., Ltd. China. Pressure<$1\times10^{-3}$ Pa). The pressure of the vapor deposition was $5\times10^{-4}$ Pa. The speed of depositing the electron injection layer, the electron transport layer, the luminescent layer, the hole transport layer and the hole injection layer was 1 nm/s. The speed of depositing the anode was 5 nm/s. Thickness of the electron injection layer was 1 nm. Thickness of the electron transport layer was 60 nm. Thickness of the luminescent layer was 15 nm. Thickness of the hole transport layer was 40 nm. Thickness of the hole injection layer was 30 nm. Thickness of the anode was 150 nm.

The organic electroluminescent device according to this embodiment was a top-emitting organic electroluminescent device having a reversed structure, which includes a glass substrate 1, a cathode 2, an electron injection layer 3, an electron transport layer 4, a luminescent layer 5, a hole transport layer 6, a hole injection layer 7 and an anode 8. The structure as shown in FIG. 1 is Glass substrate/(CuPc:ZnO)/$Cs_2CO_3$/Bphen/$Alq_3$/TCTA/$MoO_3$/Ag. (CuPC:ZnO) is notation for "CuPc and ZnO", which were used as starting materials for preparing cathode.

Example 2

A method for preparing organic electroluminescent device comprises the following steps.

(1) After a photolithography process, glass was cut into the size of $2\times2$ cm and the luminous area was $0.3\times0.3$ cm. The glass was then sonicated successively with detergent, deionized water, acetone, ethanol and isopropanol for 15 minutes to remove the organic pollutant on the surface of the glass. 3 g of zinc oxide having a particles size of 200 nm were dissolved with 10 ml of acetic acid to obtain a zinc oxide solution with a concentration of 0.3 g/ml, followed by adding 0.03 g of ZnPc to obtain a mixture. The mixture was coated on the glass by spin coating at a speed of 2000 rpm for 15 s. Then the glass was dried at 100° C. for 60 minutes to obtain a cathode. Thickness of the cathode was 50 nm.

(2) An electron injection layer of CsF, an electron transport layer of TPBi, a luminescent layer of DCJTB, a hole transport layer of NPB, a hole injection layer of $WO_3$ and an anode of Al were vapor deposited successively on the cathode to obtain an organic electroluminescent device. The vapor deposition was conducted on a high vacuum deposition device (Shenyang Scientific Instrument Development Center Co., Ltd. China. Pressure<$1\times10^{-3}$ Pa). The pressure of the vapor deposition was $5\times10^{-3}$ Pa. The speed of depositing the electron injection layer, the electron transport layer, the luminescent layer, the hole transport layer and the hole injection layer was 0.5 nm/s. The speed of depositing the anode was 10 nm/s. Thickness of the electron injection layer was 10 nm. Thickness of the electron transport layer was 80 nm. Thickness of the luminescent layer was 5 nm. Thickness of the hole transport layer was 60 nm. Thickness of the hole injection layer was 20 nm. Thickness of the anode was 250 nm.

The organic electroluminescent device according to this embodiment was a top-emitting organic electroluminescent device having a reversed structure, which includes a glass substrate, a cathode, an electron injection layer, an electron transport layer, a luminescent layer, a hole transport layer, a hole injection layer and an anode. The structure is Glass substrate/(ZnPc:ZnO)/CsF/TPBi/DCJTB/NPB/$WO_3$/Al. (ZnPC:ZnO) is notation for "ZnPc and ZnO", which were used as starting materials for preparing cathode.

Example 3

A method for preparing organic electroluminescent device comprises the following steps.

(1) After a photolithography process, glass was cut into the size of $2\times2$ cm and the luminous area was $0.3\times0.3$ cm. The glass was then sonicated successively with detergent, deionized water, acetone, ethanol and isopropanol for 15 minutes to remove the organic pollutant on the surface of the glass. 24 g of zinc oxide having a particles size of 50 nm were dissolved with 40 ml of acetic acid to obtain a zinc oxide solution with a concentration of 0.6 g/ml, followed by adding 2.4 g of MgPc to obtain a mixture. The mixture was coated on the glass by spin coating at a speed of 6000 rpm for 60 s. Then the glass was dried at 150° C. for 30 minutes to obtain a cathode. Thickness of the cathode was 10 nm.

(2) An electron injection layer of $CsN_3$, an electron transport layer of Bphen, a luminescent layer of BCzVBi, a hole transport layer of TCTA, a hole injection layer of $V_2O_5$ and an anode of Au were vapor deposited successively on the cathode to obtain an organic electroluminescent device. The vapor deposition was conducted on a high vacuum deposition device (Shenyang Scientific Instrument Development Center Co., Ltd. China. Pressure<$1\times10^{-3}$ Pa). The pressure of the vapor deposition was $2\times10^{-5}$ Pa. The speed of depositing the electron injection layer, the electron transport layer, the luminescent layer, the hole transport layer and the hole injection layer was 0.1 nm/s. The speed of depositing the anode was 7 nm/s. Thickness of the electron injection layer was 0.5 nm. Thickness of the electron transport layer was 60 nm. Thickness of the luminescent layer was 40 nm. Thickness of the hole transport layer was 20 nm. Thickness of the hole injection layer was 80 nm. Thickness of the anode was 120 nm.

The organic electroluminescent device according to this embodiment was a top-emitting organic electroluminescent device having a reversed structure, which includes a glass substrate, a cathode, an electron injection layer, an electron transport layer, a luminescent layer, a hole transport layer, a hole injection layer and an anode. The structure is Glass substrate/(MgPc:ZnO)/$CsN_3$/Bphen/BCzVBi/TCTA/$V_2O_5$/Au. (MgPC:ZnO) is notation for "MgPc and ZnO", which were used as starting materials for preparing cathode.

Example 4

A method for preparing organic electroluminescent device comprises the following steps.

(1) After a photolithography process, glass was cut into the size of $2\times2$ cm and the luminous area was $0.3\times0.3$ cm. The glass was then sonicated successively with detergent, deionized water, acetone, ethanol and isopropanol for 15 minutes to remove the organic pollutant on the surface of the glass. 9 g of zinc oxide having a particles size of 80 nm were dissolved with 20 ml of acetic acid to obtain a zinc oxide solution with a concentration of 0.5 g/ml, followed by adding 0.54 g of $V_2Pc_5$ to obtain a mixture. The mixture was coated on the glass by spin coating at a speed of 2500 rpm for 50 s. Then the glass was dried at 200° C. for 25 minutes to obtain a cathode. Thickness of the cathode was 25 nm.

(2) An electron injection layer of LiF, an electron transport layer of Bphen, a luminescent layer of AND (Jilin Optical and Electronic Materials Co. Ltd, China), a hole transport layer of NPB, a hole injection layer of $WO_3$ and an anode of Pt were vapor deposited successively on the cathode to obtain an organic electroluminescent device. The vapor deposition was conducted on a high vacuum deposition device (Shenyang Scientific Instrument Development Center Co., Ltd. China. Pressure<$1\times10^{-3}$ Pa). The pressure of the vapor deposition was $2\times10^{-4}$ Pa. The speed of depositing the electron injection layer, the electron transport layer, the luminescent layer, the hole transport layer and the hole injection layer was 0.2 nm/s. The speed of depositing the anode was 6 nm/s. Thickness of the electron injection layer was 7 nm. Thickness of the electron transport layer was 45 nm. Thickness of the luminescent layer was 30 nm. Thickness of the hole transport layer was 20 nm. Thickness of the hole injection layer was 80 nm. Thickness of the anode was 80 nm.

The organic electroluminescent device according to this embodiment was a top-emitting organic electroluminescent device having a reversed structure, which includes a glass substrate, a cathode, an electron injection layer, an electron transport layer, a luminescent layer, a hole transport layer, a hole injection layer and an anode. The structure is Glass substrate/($V_2Pc_5$:ZnO)/LiF/Bphen/AND/NPB/$WO_3$/Pt. ($V_2PC_5$:ZnO) is notation for "$V_2Pc_5$ and ZnO", which were used as starting materials for preparing cathode.

Comparative Example

A current-voltage tester (Keithley instruments Inc. US. model: 2602), an electroluminescent spectrometer (Photo Research, Inc. US. Model: PR650), and a screen luminance meter (Beijing Normal University, China. ST-86LA) were used to detect luminance of the organic electroluminescent device while varying the voltage. Test objects include the devices prepared according to Example 1-4 and a comparative device. Structure of the comparative device can be described as Glass substrate/ITO/$MoO_3$/TCTA/$Alq_3$/Bphen/$Cs_2CO_3$/Al. Substances above the glass substrate were materials of anode, hole injection layer, hole transport layer, luminescent layer, electron transport layer, electron injection layer and cathode. The glass substrate herein was the same as Examples 1-4. Anode was ITO having a thickness of 120 nm. ITO glass can also be purchased in the market. Thickness of the hole injection layer was 30 nm; thickness of the hole transport layer was 40 nm; thickness of the luminescent layer was 15 nm; thickness of the electron transport layer was 60 nm; thickness of the electron injection layer was 1 nm; and thickness of cathode was 150 nm. All the layers were prepared by common deposition method. The comparative device is a commonly encountered bottom-emitting organic electroluminescent device. Table 1 shows luminance data of the devices prepared according to Example 1-4 and the comparative device.

TABLE 1 luminance of the devices prepared according to Example 1-4 and the comparative device (voltage: 10 V)

| Test Object | Example 1 | Example 2 | Example 3 | Example 4 | Comparative Example |
|---|---|---|---|---|---|
| Luminance/ cd/m² | 19351 | 14554 | 14205 | 18521 | 14161 |

Figure 2:
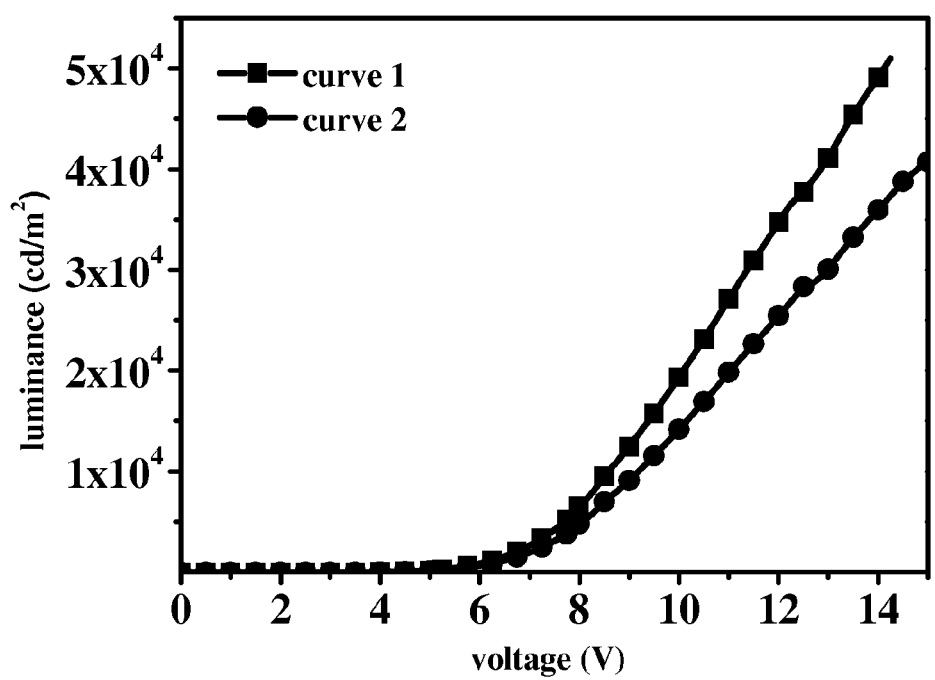
FIG. 2 shows luminance-voltage curves of the organic electroluminescent device prepared according to Example 1 and a comparative device, corresponding to curve 1 and curve 2, respectively.

FIG. 2 shows luminance-voltage curves of the organic electroluminescent device prepared according to Example 1 and the comparative device, corresponding to curve 1 and curve 2, respectively. It can be seen that luminance of the present invention is higher than that of the comparative device. Table 1 shows that luminance of the comparative device is only 14161 cd/m² when the voltage is 10V, whereas luminance of the device according to Examples 1-4 reach 14205-19351 cd/m². Further, luminance of the device according to Example 1 is up to 19351 cd/m². Compared to the comparative device, the luminance is increased by 35.6%. It indicates that the present invention improve the electron injection by preparing a cathode using zinc oxide and phthalocyanine substance. Light should be scattered by the crystals of phthalocyanine substance, thus improving luminous efficiency of the organic electroluminescent device.

While the present invention has been described with reference to particular embodiments, it will be understood that the embodiments are illustrative and that the invention scope is not so limited. Alternative embodiments of the present invention will become apparent to those having ordinary skill in the art to which the present invention pertains. Such alternate embodiments are considered to be encompassed within the spirit and scope of the present invention.

What is claimed is:

1. A method for preparing an organic electroluminescent device, comprising:
   providing a clean glass substrate and then preparing a cathode on the glass substrate by the following steps:
      dissolving zinc oxide with acetic acid to obtain a zinc oxide solution with a concentration of 0.3 g/ml-0.6 g/ml, followed by adding a phthalocyanine substance in an amount of 1%-10% by weight of the zinc oxide to obtain a mixture;
      spin-coating the mixture on the glass substrate and then drying to obtain the cathode; the phthalocyanine substance is selected from a group consisting of copper phthalocyanine (CuPc), zinc phthalocyanine (ZnPc), magnesium phthalocyanine (MgPc) and vanadium phthalocyanine ($V_2Pc_5$);
   preparing by vapor deposition, an electron injection layer, an electron transport layer, a luminescent layer, a hole transport layer, a hole injection layer and an anode being successively stacked on the cathode to obtain the organic electroluminescent device.

2. The method for preparing the organic electroluminescent device of claim 1, wherein a particle size of the zinc oxide is in a range of 50 nm-200 nm.

3. The method for preparing the organic electroluminescent device of claim 1, wherein the step of spin-coating is conducted at a speed of 2000 rpm-6000 rpm for 10 s-60 s.

4. The method for preparing the organic electroluminescent device of claim 1, wherein the step of drying is conducted at a temperature of 100° C.-200° C. for 15 minutes –60 minutes.

5. The method for preparing the organic electroluminescent device of claim 1, wherein a material of the electron injection layer is cesium carbonate, cesium fluoride, cesium azide or lithium fluoride.

6. The method for preparing the organic electroluminescent device of claim 1, wherein the vapor deposition is vacuum evaporation, and the deposition is conducted at a pressure of $2 \times 10^{-5}$ Pa-$5 \times 10^{-3}$ Pa at a speed of 0.1 nm/s-10 nm/s.

7. The method for preparing the organic electroluminescent device of claim 6, wherein the pressure of the vapor deposition is $5 \times 10^{-4}$ Pa, and a speed of depositing the electron injection layer, the electron transport layer, the luminescent layer, the hole transport layer and the hole injection layer is 1 nm/s, and a speed of depositing the anode is 5 nm/s.

* * * * *